(12) United States Patent
Riechert et al.

(10) Patent No.: US 8,536,620 B2
(45) Date of Patent: Sep. 17, 2013

(54) INTEGRATED CIRCUIT INCLUDING A HETERO-INTERFACE AND SELF ADJUSTED DIFFUSION METHOD FOR MANUFACTURING THE SAME

(75) Inventors: Henning Riechert, Ottobrunn (DE); Walter Michael Weber, Dresden (DE)

(73) Assignee: Qimonda AG, Munich (DE)

( * ) Notice: Subject to any disclaimer, the term of this patent is extended or adjusted under 35 U.S.C. 154(b) by 398 days.

(21) Appl. No.: 12/242,137

(22) Filed: Sep. 30, 2008

(65) Prior Publication Data

US 2010/0078681 A1  Apr. 1, 2010

(51) Int. Cl.
*H01L 21/337* (2006.01)
*H01L 29/80* (2006.01)

(52) U.S. Cl.
USPC ............ 257/192; 257/E21.448; 257/E29.315; 438/172

(58) Field of Classification Search
CPC .................................................. H01L 29/78696
USPC .......................... 438/192, 172; 257/192, 191

See application file for complete search history.

(56) References Cited

U.S. PATENT DOCUMENTS

| | | | |
|---|---|---|---|
| 2007/0064478 A1* | 3/2007 | Zhang et al. | 365/185.01 |
| 2007/0105333 A1* | 5/2007 | Gutsche et al. | 438/385 |
| 2007/0108514 A1* | 5/2007 | Inoue et al. | 257/330 |
| 2008/0290421 A1* | 11/2008 | Wang et al. | 257/384 |
| 2009/0061568 A1* | 3/2009 | Bangsaruntip et al. | 438/151 |

FOREIGN PATENT DOCUMENTS

DE  102005058466 A1  6/2007

* cited by examiner

*Primary Examiner* — Jarrett Stark
*Assistant Examiner* — Lawrence Tynes, Jr.
(74) *Attorney, Agent, or Firm* — Edell, Shapiro & Finnan, LLC

(57) ABSTRACT

An integrated circuit including a hetero-interface and a manufacturing method thereof is disclosed. One embodiment includes forming a hetero-structure including a hetero-interface at a junction between a first region and a second region, and, thereafter introducing a material into the first region and at least up to the hetero-interface, wherein a diffusion constant of the material is higher in the first region than in the second region.

9 Claims, 4 Drawing Sheets

INTEGRATED CIRCUIT INCLUDING A HETERO-INTERFACE AND SELF ADJUSTED DIFFUSION METHOD FOR MANUFACTURING THE SAME

BACKGROUND

Demands on semiconductor devices with regard to scale integration, access speed and energy consumption are steadily increasing. In order to meet these demands, circuit devices may be scaled down. Scaling down of circuit devices such as field effect transistors (FETs) may, however, be accompanied by undesired physical effects, e.g., the so-called short channel defect, becoming noticeable in FETs having small channel lengths.

A method allowing manufacture of an integrated circuit with small minimum feature sizes would thus be desirable.

SUMMARY

One embodiment provides a method for manufacturing an integrated circuit. The method includes forming a hetero-structure including a hetero-interface at a junction between a first region and a second region, and thereafter introducing a material into the first region and at least up to the hetero-interface, wherein a diffusion constant of the material is higher in the first region than in the second region.

BRIEF DESCRIPTION OF THE DRAWINGS

The accompanying drawings are included to provide a further understanding of the embodiments and are incorporated in and constitute a part of this specification. The drawings illustrate embodiments and together with the description serve to explain principles of the embodiments. Other embodiments and many of the intended advantages of the embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings which form a part hereof and in which are shown by way of illustration specific embodiments in which the invention may be practiced. In this regard directional terminology, such as "top", "bottom", "vertical", "horizontal", "planar", etc. is used with reference to the orientation of the Figure(s) being described. As components of embodiments may be positioned in a number of different orientations, the directional terminology is used for purposes of illustration and no way limiting. It is to be understood that other embodiments may be utilized and structural or logical changes may be made without departing from the scope of the present invention. The following detailed description therefore is not to be taken in a limiting sense, and the scope of the present invention is defined by the appended claims.

It is to be understood that the features of various exemplary embodiments described herein may be combined with each other unless specifically noted otherwise.

Figure 1:
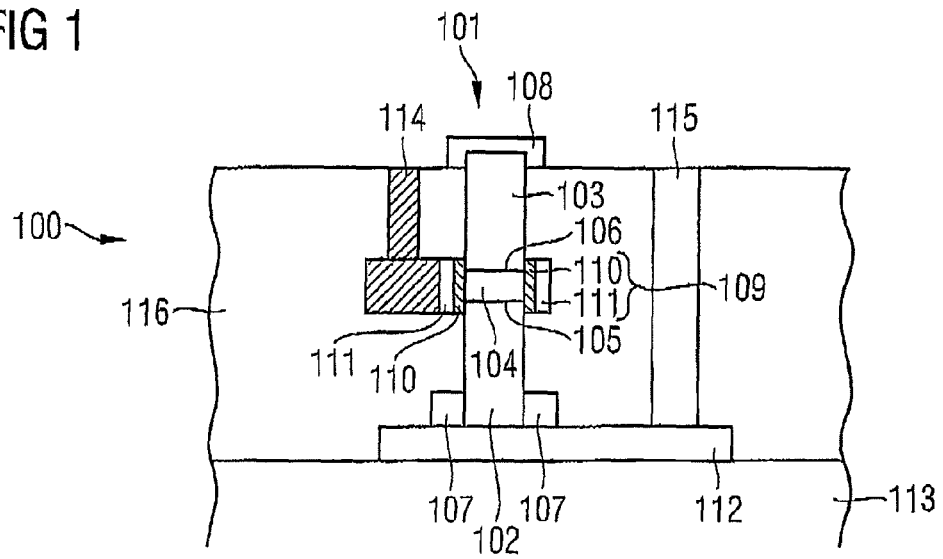
FIG. 1 illustrates a schematic cross-sectional view of one embodiment of an integrated circuit including a FET having a hetero-interface.

FIG. 1 illustrates a schematic cross-sectional view of one embodiment of an integrated circuit 100. Integrated circuit 100 includes a field effect transistor (FET) 101. FET 101 includes source/drain regions 102, 103 and a channel region 104 sandwiched in-between source/drain regions 102, 103. Source/drain region 102 and channel region 104 differ in at least one semiconductor component. The interface between source/drain region 102 and channel region 104 is a hetero-interface 105.

The term "hetero-structure" used herein refers to a structure comprising at least two regions of different material composition, the two regions adjoining to each other via a hetero-interface. By way of example, the hetero-structure may include insulating/metallic regions, semiconducting/insulating regions, or semiconducting/metallic regions. The hetero-structure may also include adjoining semiconducting regions of different material composition, e.g., Si/SiGe or adjoining metallic regions of different material composition.

Furthermore, source/drain region 103 and channel region 104 also differ in at least one semiconductor component. An interface between source/drain region 103 and channel region 104 is a hetero-interface 106. A material reservoir 107 is formed adjacent to source/drain region 102 and a further material reservoir 108 is formed adjacent to source/drain region 103. A gate structure 109 including a gate dielectric 110 and a gate electrode 111 is formed adjacent to channel region 104. Source/drain region 102 is formed on a conductive region 112, the conductive region 112 being formed over a carrier 113. Contact structures 114, 115 are electrically coupled to gate electrode 111 and source/drain region 102, respectively. To provide electrical isolation between neighboring conductive elements, e.g., contact regions 114, 115 and source/drain region 103, an insulating structure 116 is provided. The insulating structure 116 may include one or multiple insulating layers.

As used herein, the term "electrically coupled" is not limited to a direct coupling of elements and intervening elements may be provided between the "electrically coupled" elements. In this regard conductive region 112 is provided between the electrically coupled source/drain region 102 and contact region 115. In other embodiments contact region 115 may be directly coupled to source/drain region 102. Furthermore, an intervening element may be provided between contact region 114 and gate electrode 111.

Carrier 113 may comprise an arbitrary semiconductor material. Examples comprise Si, a Si compound such as SiGe, silicon-on-insulator (SOI), III-V semiconductor compounds such as GaAs or any other suitable substrate material. Carrier 113 may also be formed as a semiconductor layer, e.g., as an epitaxial layer on a substrate. Furthermore, conductive region 112 may be part of carrier 113. By way of example, conductive layer 112 may be a patterned conductive layer of a carrier including a layer stack of a substrate material, an insulating layer and the conductive layer, e.g., a layer stack of a silicon substrate, a $SiO_2$ layer and a conductive layer such as a doped silicon layer or a single crystalline layer such as Si, Ge, SiGe, sapphire, III-V or II-VI compound semiconductors. Furthermore, components and devices may already be formed within carrier 113.

Source/drain regions 102, 103 and channel region 104 may be parts of a nanowire. The term "nanowire" used herein refers to a structure having a lateral size constrained to tens of nanometers or less and unconstrained longitudinal size. If so, a length of channel region 104 may be defined in relation to a distance between hetero-interfaces 105, 106 without lithographic constraints. Materials from material reservoirs 107, 108 are introduced into source/drain regions 102, 103 up to hetero-interfaces 105, 106, respectively. The materials introduced into source/drain regions 102, 103 from material reservoirs 107, 108 have a diffusion constant that is higher in the source/drain regions 102, 103 than in channel region 104, respectively. Hence, propagation of the material from the reservoirs 107, 108 up to hetero-interfaces 105, 106 is faster than within channel region 104.

In one embodiment, the material introduced into source/drain regions 102, 103 is a metal leading to the formation of a metal-semiconductor alloy. Formation of this alloy proceeds from the material reservoirs 107, 108 towards the hetero-interfaces 105, 106, respectively. By way of example, a silicide such as $NiSi_2$, NiSi, or $Ni_2Si$ may be formed starting from material reservoirs 107, 108 towards hetero-interfaces 105, 106, respectively. The formation of silicide can be limited to source/drain regions 102, 103 by choosing semiconductor materials for source/drain regions 102, 103 and channel region 104 such that a diffusion constant of the material to be introduced into source/drain regions 102, 103 is higher in source/drain regions 102, 103 than in channel region 104. In the context of this embodiment, the term "diffusion constant of the material" relates to the speed of metal-semiconductor alloy or compound formation starting from material reservoirs 107, 108 towards hetero-interfaces 105, 106, respectively.

Besides forming source/drain regions 102, 103 of metal-semiconductor alloy, in another embodiment, material reservoirs 107, 108 may include dopants for source/drain regions 102, 103. These dopants may be diffused into source/drain regions 102, 103, respectively. Again, these dopants have a diffusion constant that is higher in source/drain regions 102, 103 than in channel region 104 in order to precisely control the channel dimension.

The hetero-structure including source/drain region 102, channel region 104 and source/drain region 103 may be formed of a vast variety of material combinations provided that the material, e.g., metal or dopant, to be introduced from material reservoirs 107, 108 into source/drain regions 102, 103 up to hetero-interfaces 105, 106 has a diffusion constant that is higher in source/drain regions 102, 103 than in channel region 104, respectively. By way of example, the hetero-structure of source/drain regions 102, 103 and channel region 104 may include any of the group of Si, SiGe, SiGeC, SiC, SiSn, SiGeSn, or SiGeCSn. The hetero-structure of source/drain regions 102, 103 and channel region 104 may also include Si/III-V semiconductors/Si, e.g., Si/GaAs/Si, or Si/II-VI semiconductors/Si, e.g., Si/CdTe/Si. In one embodiment, source/drain regions 102, 103 may include Si and channel region 104 may be formed of SiGe. In this case, material reservoirs 107, 108 may be reservoirs including Ni. When introducing Ni from reservoirs 107, 108 into Si regions 102, 103, e.g., by thermal processing, Ni may be diffused towards hetero-interfaces 105, 106 and may react with Si to form $NiSi_2$, NiSi, or $Ni_2Si$. The definition of source/drain regions 102, 103 and channel region 104 by introduction of the materials from reservoirs 107, 108 may be precisely controlled as the formation of the $NiSi_2$ proceeds slower within SiGe channel region 104 than in Si source/drain regions 102, 103.

Integrated circuit 100 of FIG. 1 may be varied in many ways. Although material reservoirs 107, 108 remain in the embodiment illustrated in FIG. 1, one or both of these regions may also be removed during manufacture of integrated circuit 100, e.g., by an etch process.

In a further embodiment, one of source/drain regions 102, 103 may be a metal-semiconductor alloy region, whereas the other one of source/drain regions 102, 103 may be a doped semiconductor region. Hence, one of material reservoirs 107, 108 is a reservoir including metal, whereas the other one of material reservoirs 107, 108 is a reservoir including dopants, e.g., an oxide of dopants such as $B_2O_3$, $P_2O_5$, $As_2O_3$, or $Sb_2O_3$.

In yet another embodiment, the stack of source/drain region 102, channel region 104 and source/drain region 103 includes a single hetero-interface. By way of example, hetero-interface 105 may be formed between source/drain region 102 and channel region 104, whereas source/drain region 103 and channel region 104 may be formed of same semiconductor materials. As an alternative, the hetero-interface 106 may be formed between source/drain region 103 and channel region 104 whereas source/drain region 102 and channel region 104 may be formed of same semiconductor materials or yet a different material formed by another method such as epitaxy, for example. Even if both hetero-interfaces 105, 106 are present, source/drain regions 102, 103 may be formed of different semiconductor components.

Gate structure 109 may partly or completely surround channel region 104. Furthermore, gate structure 109 may include a stack of at least one insulating layer and one conductive layer. Gate structure 109 may also include a charge storage layer, e.g., a floating gate layer. Conductive layer 102 may be a seed layer for growth of a nanowire thereon, for example.

Figure 2:
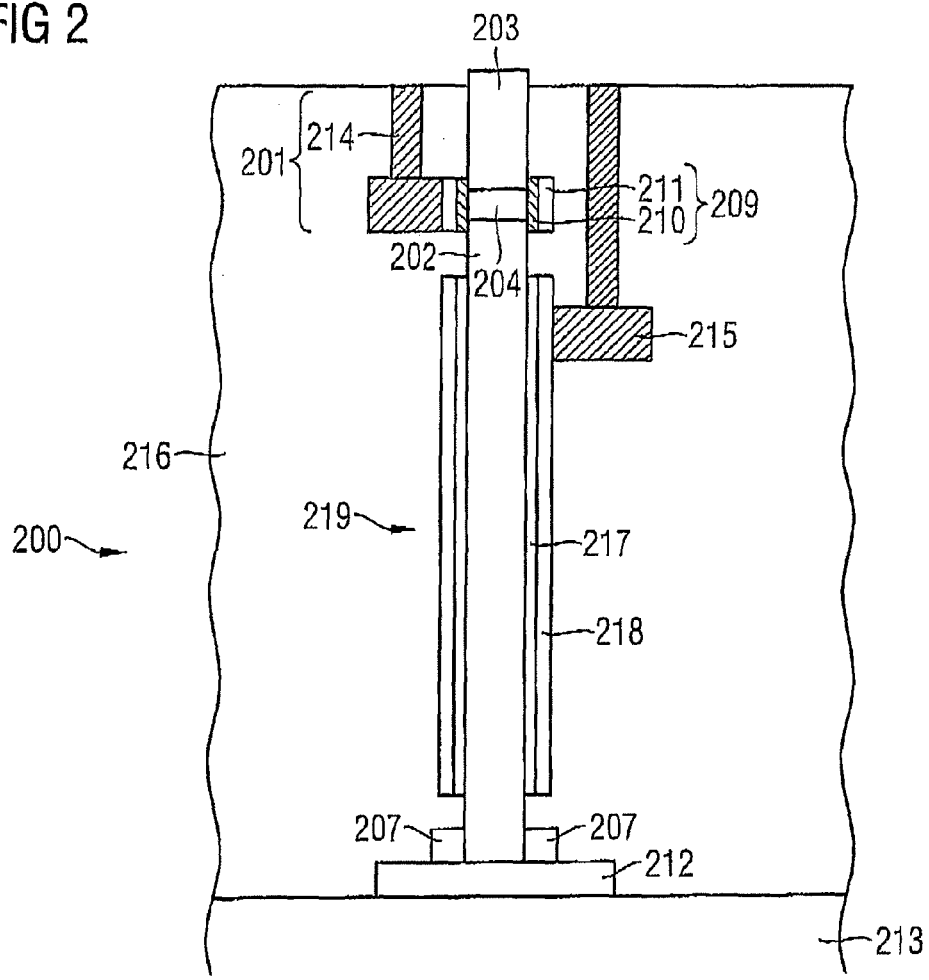
FIG. 2 illustrates a schematic cross-sectional view of one embodiment of an integrated circuit including a FET having a hetero-interface as well as a capacitor.

FIG. 2 illustrates a cross-sectional view of one embodiment of an integrated circuit 200. Similarly to the embodiment illustrated in FIG. 1, integrated circuit 200 includes FET 201 comprising source/drain regions 202, 203, channel region 204, gate structure 209 including gate dielectric 210 and gate electrode 211, material reservoir 207, conductive layer 212, carrier 213, contact regions 214, 215 and insulating structure 216.

Integrated circuit 200 furthermore includes a storage capacitor. The storage capacitor may comprise a capacitor dielectric 217 and a first capacitor electrode 218. In this embodiment, source/drain region 202 is extended compared to the structure shown in FIG. 1 and also constitutes the second capacitor electrode of capacitor 219. FET 201 and capacitor 219 may constitute a DRAM (Dynamic Random Access Memory) cell. It is to be noted that further embodiments including a hetero-structure as elucidated above with reference to FIG. 1 may relate to memory concepts other than DRAM or embedded DRAM such as EPROM (Erasable Programmable Read only Memory), EEPROM (Electrically Erasable Programmable Read Only Memory), NROM (Nitrided Read Only Memory) and further volatile and non-volatile memory concepts. The storage capacitor may as well be disposed over the substrate surface.

Figure 3:
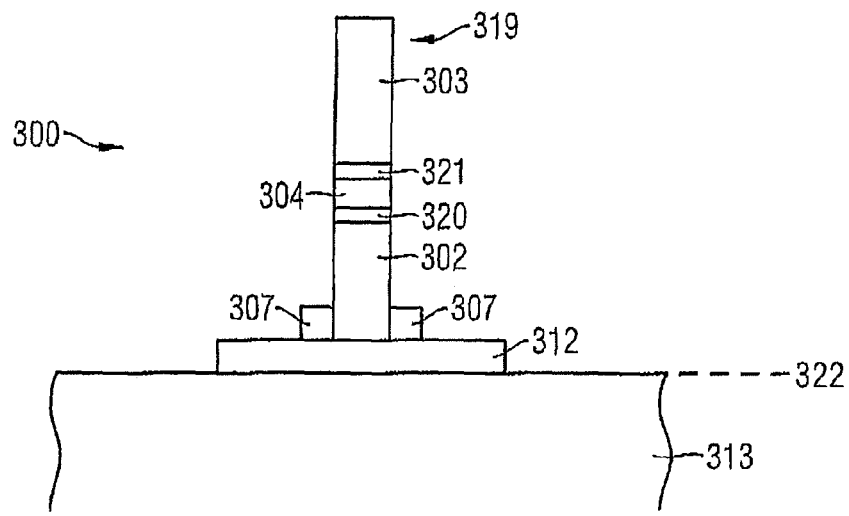
FIG. 3 illustrates a simplified cross-sectional view of one embodiment of an integrated circuit including a FET having a nanowire-heterostructure.

FIG. 3 illustrates a simplified cross-sectional view of one embodiment of an integrated circuit 300 including a hetero-interface. Similarly to the embodiments illustrated in FIGS. 1 and 2, integrated circuit 300 includes carrier 313 and conductive layer 312. Again, conductive layer 312 may be a seed layer assisting growth of nanowire hetero-structure 319.

Nanowire hetero-structure 319 includes a stack of source/drain region 302, barrier region 320, channel region 304, barrier region 321 and source/drain region 303. Source/drain regions 302, 303 and barrier regions 320, 321 may include semiconductor and/or metal components. By way of example, nanowire hetero-structure 319 may be a layer stack of Si/TiN/Si/TiN/Si, Si/TiN/SiGe/TiN/Si Si/TaN/Si/TaN/Si, Si/TaN/SiGe/TaN/Si, Si/Ru/Si/Ru/Si, or SI/Ru/SiGe/Ru/Si. Here, barrier layers 320, 321 formed of TiN act as a diffusion barrier for materials to be introduced from material reservoir 307 into the nanowire hetero-structure 319. It is to be noted that integrated circuit 300 may include further elements, e.g., any additional elements illustrated in the embodiments of FIGS. 1 and 2, e.g., a further material reservoir adjacent to source/drain region 303. Layers 320, 321 are chosen such that the diffusion constant for materials introduced from material reservoir 307 into nanowire hetero-structure 319 is lower than that of regions 302, 303 independently of the diffusion constant in region 304.

Although the embodiments illustrated in FIGS. 1 to 3 relate to vertical FET concepts having source/drain regions and channel region stacked in a direction perpendicular to a surface of carrier 113, 213, 313, e.g., perpendicular to surface 322 in FIG. 3, other embodiments may cover other FET concepts, other transistor concepts or diodes.

Figure 4:
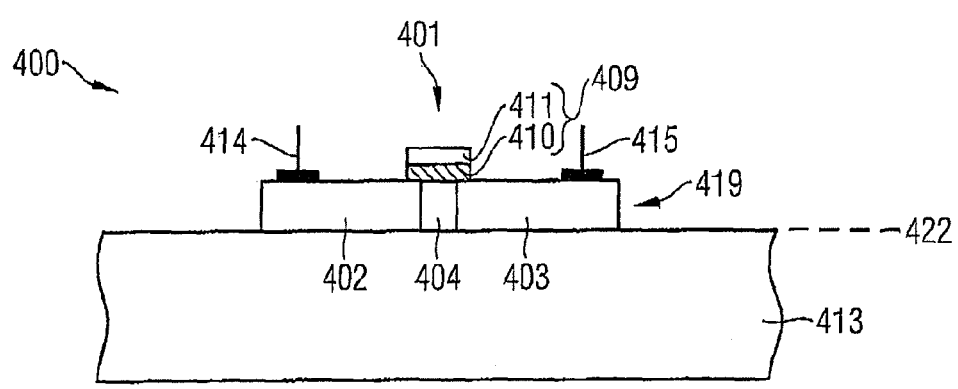
FIG. 4 illustrates a schematic cross-sectional view of one embodiment of an integrated circuit including a planar FET having a hetero-interface.

FIG. 4 illustrates a cross-sectional view of one embodiment of an integrated circuit 400. Integrated circuit 400 includes FET 401. FET 401 includes hetero-structure nanowire 419 comprising source/drain regions 402, 403 and channel region 404. Gate structure 409 including gate dielectric 410 and gate electrode 411 is arranged adjacent to channel region 404. Contact regions 414, 415 are electrically coupled to source/drain regions 402, 403, respectively.

FET 401 is planar, i.e., source/drain regions 402, 403 and channel region 404 are arranged along a surface 422 of carrier 413. Similarly to the embodiment illustrated in FIG. 1, the sequence of source/drain region 402, channel region 404 and source/drain region 403 includes at least one hetero-interface. Material reservoirs may be formed adjacent to any of source/drain regions 402, 403 (not shown in FIG. 4). The variations illustrated with regard to the vertical FET concepts of FIGS. 1 and 3 also apply to the planar FET concept illustrated in FIG. 4.

It is to be noted that integrated circuits 100-400 illustrated in the schematic cross-sectional views of FIGS. 1 to 4 may include a plurality of the illustrated FETs, i.e., an array of FETs, as well as further circuit parts, e.g., sense amplifiers. By way of example, these integrated circuits may include chips for applications such as memory, automotive, consumer, chip card and security, industrial, wireless communications, wireline.

Figure 5:
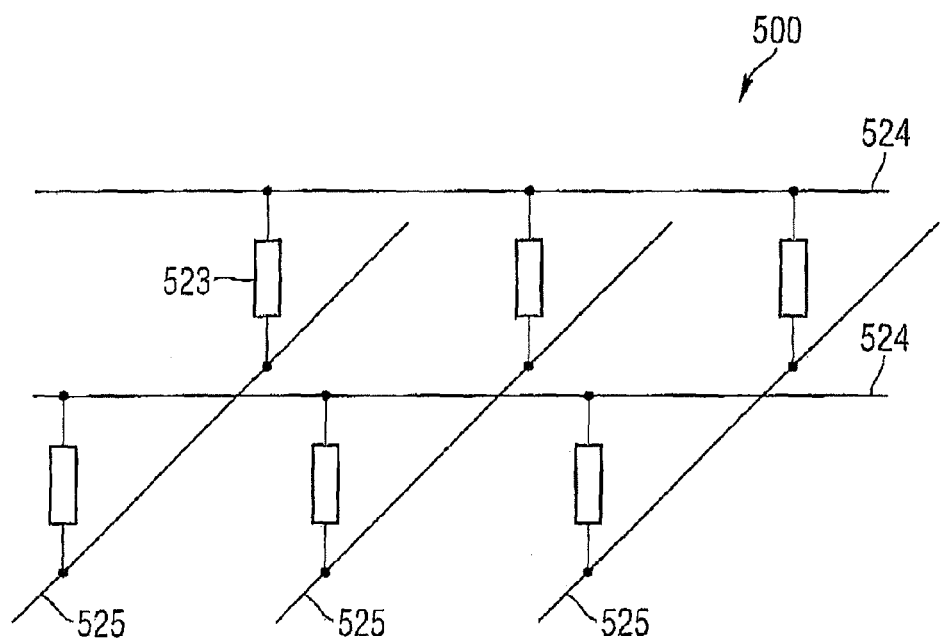
FIG. 5 illustrates a schematic view of one embodiment of an integrated circuit including semiconductor memory cells.

FIG. 5 illustrates one embodiment of an integrated circuit 500 including an array of semiconductor memory cells 523. Each of semiconductor memory cells 523 includes a FET according to any of the embodiments described above. Each of memory cell 523 may be a 1T (1 transistor) memory cell having a storage region within a gate structure, i.e., lacking a storage capacitor, for example. Memory cells 523 may, however, also be 1T-1C (1 transistor-1 capacitor) memory cells such as DRAM memory cells or any other memory cell concept may be adopted that includes a FET according to any of the embodiments described above. Each of the FETs of the memory cell 523 may be electrically coupled to a word line 524 by its gate structure and may further be coupled to a bit line 525 by one of its source/drain regions. Word lines 524 and bit lines 525 may run perpendicular to each other, for example. Each of word lines 524 and bit lines 525 may be electrically coupled to further circuits (not shown in FIG. 5) configured to support a read/write operation with respect to a memory cell 523. These further circuits may include sense amplifiers and decoders, for example.

Figure 6:
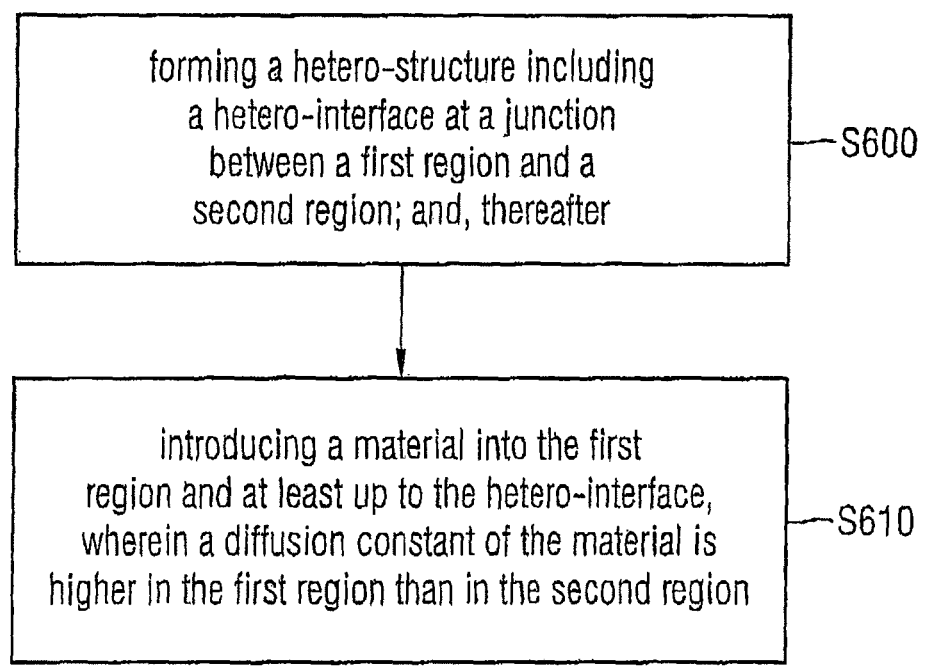
FIG. 6 is a block diagram illustrating one embodiment of a method for manufacturing an integrated circuit including a hetero-interface.

FIG. 6 is a block diagram illustrating one embodiment of a method for manufacturing an integrated circuit including a hetero-interface. In S600 a hetero-structure is formed, the hetero-structure including a hetero-interface at a junction between a first region and a second region. Thereafter, in S610, a material is introduced into the first region and at least up to the hetero-interface wherein a diffusion constant of the material is higher in the first region than in the second semiconductor region. This allows alteration of the material in the first region in a self-aligned manner. By way of example, the first region may be doped or alloyed. A precise adjustment of device dimensions also in a range of several nanometers to several tens of nanometers may thus be achieved. First/second regions may be any regions of semiconductor/semiconductor, metal/semiconductor, semiconductor/phase change, insulator/semiconductor and insulator/phase change, for example. Phase change regions may be formed of chalcogenide glasses such as GeSbTe or AgInSbTe, for example. By introducing the material into the first region in case of the second region being a phase change region, the first region may be used as a conductive region providing electrical connection to the phase change region for example. The material may be introduced by diffusion. As a further example, the material may be implanted.

The material may form a substitial or interstitial with regard to the lattice of the first region.

In one embodiment, the material is a metal and a metal-semiconductor alloy is formed from the first region and the metal. To introduce the metal into the first region, a metal diffusion reservoir may be formed adjacent to the first region and the metal may be diffused from the metal diffusion reservoir into the first region. Apart from forming a metal-semiconductor alloy, e.g., a metal silicide, the material may also be chosen as a dopant of the first semiconductor region. In latter case, a dopant reservoir such as an oxide of the dopant, e.g., $P_2O_5$, may be formed adjacent to the first semiconductor region.

In one embodiment, the first region and the second region may form at least part of a nanowire. The first semiconductor region may define at least part of a source/drain region of a FET and the second semiconductor region may define at least part of a channel region of the FET.

In yet another embodiment, a further hetero-structure is formed, the further semiconductor hetero-structure including a hetero-interface, a junction between the second region and a third region. Thereafter, a material may be introduced into the third region and at least up to the further hetero-interface, wherein a diffusion constant of the material is higher in the third region than in the second region. As source/drain regions may be formed of the first and third regions by introducing the material therein, e.g., by doping these regions with dopants or by forming a metal-semiconductor alloy, such as a metal silicide, dimensions of a channel region to be formed within the second region may be precisely controlled as the material diffuses slower within the second region than within the first region, and, optionally within the third semiconductor region. Hence, a self-controlled process for forming source/drain regions may be achieved. Channel lengths in the range of several nanometers to several tens of nanometers may be formed.

The hetero-structure nanowire may be formed by any known method, e.g., using an eutectic such as Al/Si, Au/Si, Ti/Si, Pd/Si, In/Si, Ga/Si on a Si seed layer and supplying a source gas, e.g., SiH$_4$, to grow a silicon nanowire in a direction perpendicular to a surface of the Si seed layer. The hetero-structure may be achieved by control of supply gases, e.g., SiH$_4$ and GeH$_4$ to form a Si/SiGe hetero-structure.

Although specific embodiments have been illustrated and described herein it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising a transistor, the transistor including:
    a source/drain region comprising a metal-semiconductor alloy region, the metal-semiconductor alloy region comprising at least one metal component and at least one semiconductor component;
    a channel region comprising a semiconductor region, the semiconductor region adjoining to the metal-semiconductor alloy region; and
    a reservoir of a metallic material arranged adjacent to the metal-semiconductor alloy region and non-adjacent to the channel region; wherein
    the metal-semiconductor alloy region and the semiconductor region differ in at least one semiconductor component such that a diffusion constant of a metal in the metal-semiconductor alloy region is higher in the metal-semiconductor alloy region than in the semiconductor region, and
    the metallic material comprises the metal in the metal-semiconductor alloy.

2. The integrated circuit of claim 1, wherein at least one of the metal-semiconductor alloy region and the semiconductor region comprises silicon.

3. The integrated circuit of claim 2, wherein the metal-semiconductor alloy region comprises a metal silicide.

4. The integrated circuit of claim 1, wherein the semiconductor region forms a portion of a nanowire.

5. The integrated circuit of claim 1, wherein a reservoir of oxide material is arranged adjacent to the metal-semiconductor alloy region, wherein the oxide material comprises a dopant of the metal-semiconductor region.

6. The integrated circuit portion of claim 5, wherein at least one of the reservoir of metallic material and the reservoir of oxide material is arranged adjacent to a source-region of the metal-semiconductor alloy region, and the other of the reservoir of metallic material and the reservoir of oxide material is arranged adjacent to a drain-region of the metal-semiconductor alloy region.

7. The integrated circuit of claim 5, further comprising:
    a first barrier region arranged between a source-region of the metal-semiconductor alloy region and the semiconductor region; and
    a second barrier region arranged between a drain-region of the metal-semiconductor alloy region and the semiconductor region.

8. The integrated circuit of claim 1, wherein at least one of the following semiconductor elements or semi-conductor compounds is present in only one of the metal-semiconductor alloy region and the semiconductor region: Ge, C, Sn, a III-V semiconductor compound, and a II-VI semiconductor compound.

9. The integrated circuit of claim 1, wherein Ge is a semiconductor element of the semiconductor region and not a semiconductor element of the metal-semiconductor alloy region.

* * * * *